(12) United States Patent
Hori et al.

(10) Patent No.: US 12,416,679 B2
(45) Date of Patent: Sep. 16, 2025

(54) BATTERY MONITORING APPARATUS

(71) Applicant: DENSO CORPORATION, Kariya (JP)

(72) Inventors: Yuuki Hori, Kariya (JP); Masaki Uchiyama, Kariya (JP)

(73) Assignee: DENSO CORPORATION, Kariya (JP)

( * ) Notice: Subject to any disclaimer, the term of this patent is extended or adjusted under 35 U.S.C. 154(b) by 183 days.

(21) Appl. No.: 18/211,817

(22) Filed: Jun. 20, 2023

(65) Prior Publication Data
US 2023/0333173 A1 Oct. 19, 2023

Related U.S. Application Data

(63) Continuation of application No. PCT/JP2021/045660, filed on Dec. 10, 2021.

(30) Foreign Application Priority Data

Dec. 17, 2020 (JP) .................. 2020-209592

(51) Int. Cl.
*G01R 31/389* (2019.01)
*G01R 35/00* (2006.01)
*H01M 10/42* (2006.01)
*H02J 7/00* (2006.01)

(52) U.S. Cl.
CPC ......... *G01R 31/389* (2019.01); *G01R 35/005* (2013.01); *H01M 10/4285* (2013.01); *H02J 7/0047* (2013.01)

(58) Field of Classification Search
None
See application file for complete search history.

(56) References Cited

U.S. PATENT DOCUMENTS

| | | | |
|---|---|---|---|
| 6,748,273 B1 * | 6/2004 | Obel | G01R 31/389 607/29 |
| 2004/0012373 A1 | 1/2004 | Sakakibara et al. | |
| 2004/0135548 A1 | 7/2004 | Takano et al. | |
| 2010/0247988 A1 | 9/2010 | Okumura et al. | |
| 2015/0253204 A1 | 9/2015 | Hebiguchi | |
| 2016/0069963 A1 * | 3/2016 | Hebiguchi | G01R 31/389 324/430 |
| 2018/0203071 A1 | 7/2018 | Takemura et al. | |
| 2021/0208208 A1 * | 7/2021 | Yazami | H01M 10/4285 |

FOREIGN PATENT DOCUMENTS

JP 2013-101884 A 5/2013

* cited by examiner

*Primary Examiner* — Jas A Sanghera
(74) *Attorney, Agent, or Firm* — Oliff PLC

(57) ABSTRACT

A battery monitoring apparatus is provided for a secondary battery that produces a change in reaction heat at a predetermined capacity when a storage capacity changes in accompaniment with a current conduction. The battery monitoring apparatus includes: an acquiring unit that acquires, during the current conduction, an impedance change of the secondary battery; and a capacity determination unit that determines, based on the impedance change acquired by the acquiring unit, that the storage capacity of the secondary battery is the predetermined capacity.

6 Claims, 7 Drawing Sheets

BATTERY MONITORING APPARATUS

CROSS-REFERENCE TO RELATED APPLICATIONS

This application is the U.S. bypass application of International Application No. PCT/JP2021/045660 filed on Dec. 10, 2021, which designated the U.S. and claims priority to Japanese Patent Application No. 2020-209592 filed on Dec. 17, 2020, the contents of which is incorporated herein by reference.

BACKGROUND

Technical Field

The present disclosure relates to a battery monitoring apparatus of a secondary battery.

Description of the Related Art

In recent years, lithium-ion batteries have attracted attention as light weight and high energy density secondary batteries. Lithium-ion batteries have a region where a change in the open circuit voltage (OCV) in accompaniment with a change in the state of charge (SOC) of a secondary battery is small. This region is referred to as a plateau region. In the plateau region, it is difficult to calculate SOC-OCV characteristics indicating a correlation between the SOC and the open circuit voltage OCV.

SUMMARY

The present disclosure provides a battery monitoring apparatus capable of appropriately calculating the storage capacity of the secondary battery without using the SOC-OCV characteristics.

A first means to solve the above-described issues is applied to a secondary battery that produces a change in reaction heat reaction heat at a predetermined capacity when a storage capacity changes in accompaniment with a current conduction, and is provided with an acquiring unit that acquires, during current conduction, an impedance change of the secondary battery; and a capacity determination unit that determines, based on the impedance change acquired by the acquiring unit, that the storage capacity of the secondary battery is the predetermined capacity.

BRIEF DESCRIPTION OF THE DRAWINGS

The above-described objects and other objects, features and advantages of the present disclosure will be clarified further by the following detailed description with reference to the accompanying drawings. The drawings are.

DETAILED DESCRIPTION OF THE PREFERRED EMBODIMENTS

In recent years, lithium-ion batteries have attracted attention as light weight and high energy density secondary batteries. Lithium-ion batteries have a region where a change in the open circuit voltage (OCV) in accompaniment with a change in the state of charge (SOC) of a secondary battery is small. This region is referred to as a plateau region. In the plateau region, it is difficult to calculate SOC-OCV characteristics indicating a correlation between the SOC and the open circuit voltage OCV.

As a technique for calculating SOC without using the SOC-OCV characteristics, a technique is known in which an amount of current flowing into and out from the secondary battery is accumulated to obtain the SOC. However, according to the SOC calculation using a current accumulation technique, when the current accumulation period is longer, an accumulation error becomes larger, which causes deterioration of the calculation accuracy of the SOC. In this respect, International Publication No. 2017/010475 discloses a technique in which the SOC of the secondary battery is calculated in accordance with a voltage change ratio as a value where a voltage change of the secondary battery per unit time during charging or discharging is divided by an amount of current flowing into and out from the secondary battery during the charging or discharging.

The voltage change ratio in the current-conduction significantly depends on the temperature of the secondary battery. Hence, with a SOC calculation using the voltage change ratio during current conduction, the SOC cannot be appropriately calculated because of the temperature change in the secondary battery during current conduction. In this respect, a technique is desired for appropriately calculating the SOC of the secondary battery without using the SOC-OCV characteristics.

First Embodiment

Hereinafter, with reference to the drawings, a first embodiment in which a battery monitoring apparatus according to the present disclosure is applied to an on-vehicle battery control apparatus 100 will be described.

Figure 1:
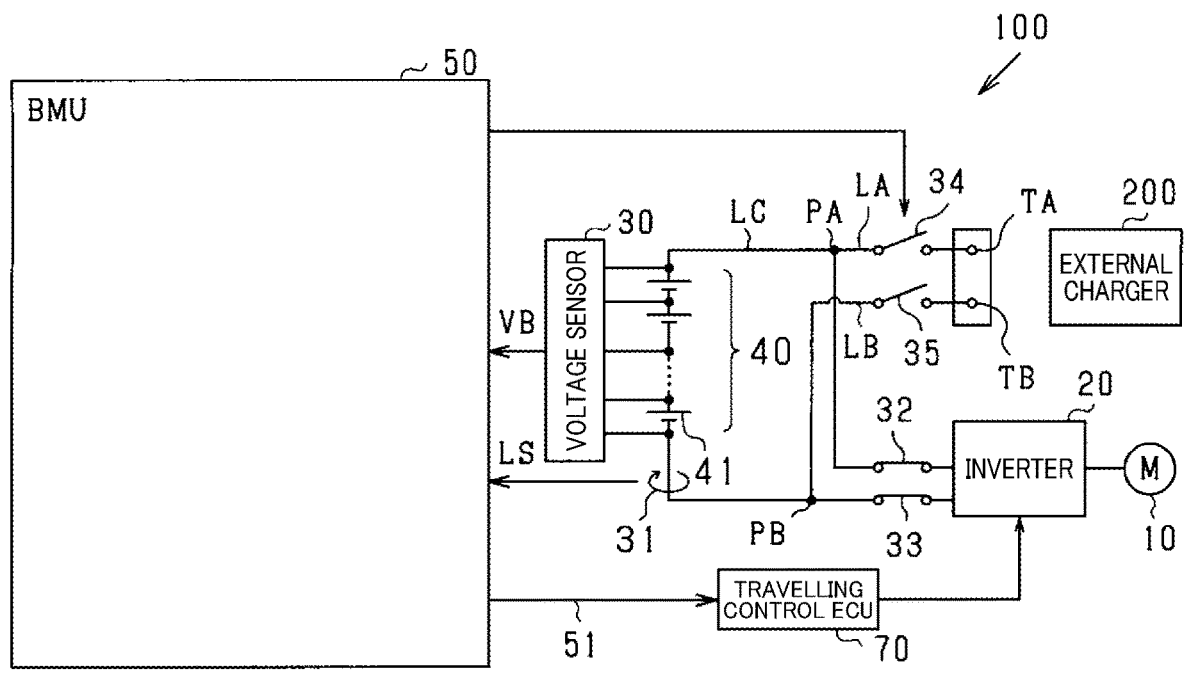
FIG. 1 is a diagram showing an overall configuration of a battery control apparatus according to a first embodiment.

As shown in FIG. 1, the battery control apparatus 100 according to the present embodiment serves as an apparatus for monitoring a storage capacity and a charge-discharge state of a battery 40. The battery 40 is a storage battery (secondary battery) capable of charging and discharging. Specifically, the battery 40 is configured as a battery pack in which a plurality of lithium-ion battery cell 41 are electrically connected in series. According to the present embodiment, as the lithium-ion battery cell 41, lithium iron phosphate and graphite are utilized for the cathode active substance and anode active substance, respectively.

The battery 40 is connected to a rotary electric machine 10 via an inverter 20. The rotary electric machine 10 exchanges (receives and outputs) electric power with the battery 40 to apply a driving force to a vehicle using the electric power supplied from the battery 40 during power running, and to generate electric power using deceleration energy of the vehicle during regenerative operation thereby supplying electric power to the battery 40.

The battery control unit is provided with a voltage sensor 30, a current sensor 41, first to fourth relay switches 32 to 35 and a battery management unit (BMU) 50 as a battery monitoring apparatus.

The voltage sensor 30 detects a terminal voltage of each lithium-ion battery cell 41 that constitutes the battery 40 and acquires a battery voltage VB which is the sum of the terminal voltages. The current sensor 31 is disposed on a connection line LC connecting the battery 40 and the inverter 20 and detects an amount of charge-discharge current IS as a current flowing into and out from the battery 40. The detection values of the respective sensors are transmitted to BMU 50.

The battery 40 is configured to be capable of being connected to an external charger 200 external to the vehicle, via a first and second external charger terminals TA and TB. The external charger 200 is, for example, a DC quick charger. When the external charger 200 is connected to the first and second external charger terminals TA and TB, the battery 40 is charged in a constant current charging or a constant voltage charging with the high voltage DC power transmitted from the external charger 200.

The first and second external charge terminals TA and TB are connected to the connection line LC via the first and second charge paths LA and LB. Specifically, the first external charge terminal TA is connected to a first contact PA on the connection line LC between the positive terminal of the battery 40 and the inverter 20 via the first charge path LA. The second external charge terminal TB is connected to a second contact PB on the connection line LC between the negative terminal of the battery 40 and the inverter 20 via the second charge path LB.

The first relay switch 32 is disposed at a portion between the first contact PA and the inverter 20 on the connection line LC, and the second relay switch 33 is disposed at a portion between the second contact PB and the inverter 20 on the connection line LC. The first and second relay switches 32 and 33 switches a connection state between the battery 40 and the rotary electric machine 10. The third relay switch 34 is disposed on the first charge path LA, and the fourth relay switch 35 is disposed on the second charge path LB. The third and fourth relay switches 34 and 35 switch the connection state between the battery 40 and the external charger 200.

The BMU 50 serves as a control apparatus composed of CPU, ROM, RAM and the like. The BMU 50 calculates the storage capacity of the battery 40 based on the detection values transmitted from respective sensors. The BMU 50 calculates a discharge capacity indicating a degree of deterioration of the battery 40.

Further, the BMU 50 is connected to the first to fourth relay switches 32 to 35 and switches the connection state between the first to fourth relay switches 32 to 35 based on the storage capacity of the battery 40. Further, the BMU 50 is communicably connected to a travelling control ECU 70 via an on-vehicle network interface 51 and outputs a command for controlling the rotary electric machine 10 based on the storage capacity of the battery 40. The travelling control ECU 70 controls the inverter 20 based on the command transmitted from the BMU 50 so as to control a control quantity of the rotary electric machine 10 in accordance with the command. The control quantity is a torque, for example.

As a method for calculating the storage capacity of the battery 40, a method of using a correlation between a state of charge (SOC) and an open circuit voltage (OCV) of the battery 40 (SOC-OCV characteristics) is known. However, according to the present embodiment, according to the present embodiment, as the lithium-ion battery cell 41 that constitutes the battery 40, lithium iron phosphate and graphite are utilized for cathode active substance and anode active substance, respectively. For a battery using such active substances, the open circuit voltage OCV is stable through a wider range of SOC and a region is present where a change in the open circuit voltage OCV accompany with a change in the SOC is small, that is, a plateau region PR is present. In the plateau region, it is difficult to calculate the SOC of the battery using the SOC-OCV characteristics to calculate the storage capacity.

In this respect, as a technique for calculating the storage capacity of the battery 40 without using the SOC-OCV characteristics, a technique is known in which the charge-discharge current IS of the battery 40 is accumulated to calculate the storage capacity. However, with the current accumulation for calculating the storage capacity, if the current accumulation period becomes longer, an accumulation error becomes larger and causes a problem in which accuracy for calculating the storage capacity is lowered.

In the storage battery, when the storage capacity changes in accompaniment with the current conduction, reaction heat WR changes. The reaction heat refer to calories in which Joule heat WJ due to impedance component of the battery is subtracted from a calorific value WB caused by the current conduction. The reaction heat WR can be expressed by the following equation (2) using a temperature TM of the battery, a charge-discharge current IS and a voltage change quantity $\Delta OCV$ as a change quantity of the open circuit voltage OCV per unit temperature.

$$WB = WJ + WR \tag{1}$$

$$WR = TM \times IS \times \Delta OCV \tag{2}$$

According to the equation (2), the reaction heat WR is proportional to the voltage change quantity $\Delta OCV$. The voltage change quantity $\Delta OCV$ has a value corresponding to each storage capacity of the battery. In some batteries, the voltage change quantity $\Delta OCV$ varies when the storage capacity changes. According to such a storage battery, since the reaction heat WR changes in accompaniment with a change in the storage capacity, the temperature TM changes. Further, the storage battery has a correlation between the temperature TM and the impedance value RA. Therefore, when thew temperature TM changes, the impedance value RA of the battery changes.

Figure 2:
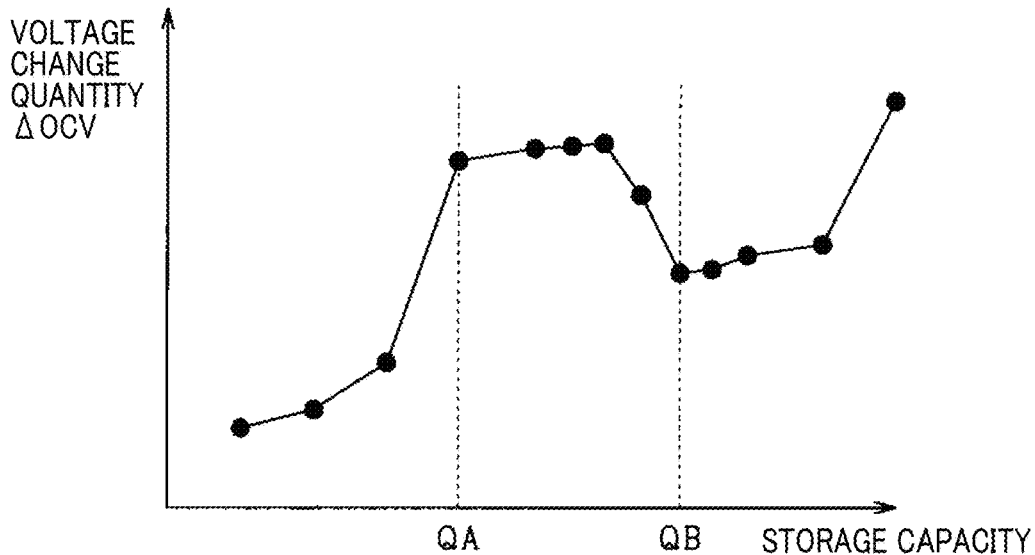
FIG. 2 is a graph showing a relationship between a storage capacity and a voltage change quantity.

In the storage battery, depending on the active substance used therefor, a predetermined capacity which causes relatively large voltage change quantity $\Delta OCV$ is determined. As shown in FIG. 2, the battery 40 has a first capacity QA and a second capacity QB as the predetermined capacity. The voltage change quantity $\Delta OCV$ rapidly increases when the storage capacity increases from small capacity side to the first capacity QA, and an increase in the voltage change quantity $\Delta OCV$ tends to saturate when the storage capacity reaches the first capacity QA. Moreover, when the storage capacity increases from the small capacity side to the second capacity QB, the voltage change quantity $\Delta OCV$ rapidly decreases, and a decrease in the voltage change quantity $\Delta OCV$ tends to saturate when the storage capacity reaches the second capacity QB.

Since the voltage change quantity $\Delta OCV$ rapidly changes towards the first and second capacities QA and QB, a change in the impedance value RA becomes large. The present disclosers have focused on the above phenomenon and discovered a method for calculating the storage capacity of the battery 40.

Specifically, the BMU 50 acquires an impedance change HA of the battery 40 during the current conduction. The BMU 50 divides a change amount ΔVB of the battery voltage VB by a change amount ΔIS of a charge-discharge current IS to calculates the impedance value RA. Then, the BMU 50 calculates the impedance change HA as an amount of change of the impedance value RA per unit time. The BMU 50 performs a determination process for determining whether the storage capacity of the battery 40 corresponds to the first capacity QA or the second capacity QB in accordance with the impedance change HA. According to this determination process, the impedance change HA at the first and second capacity QA and QB of the battery 40, and the storage capacity of the battery 40 can be appropriately calculated without using the SOC-OCV characteristics.

Figure 4:
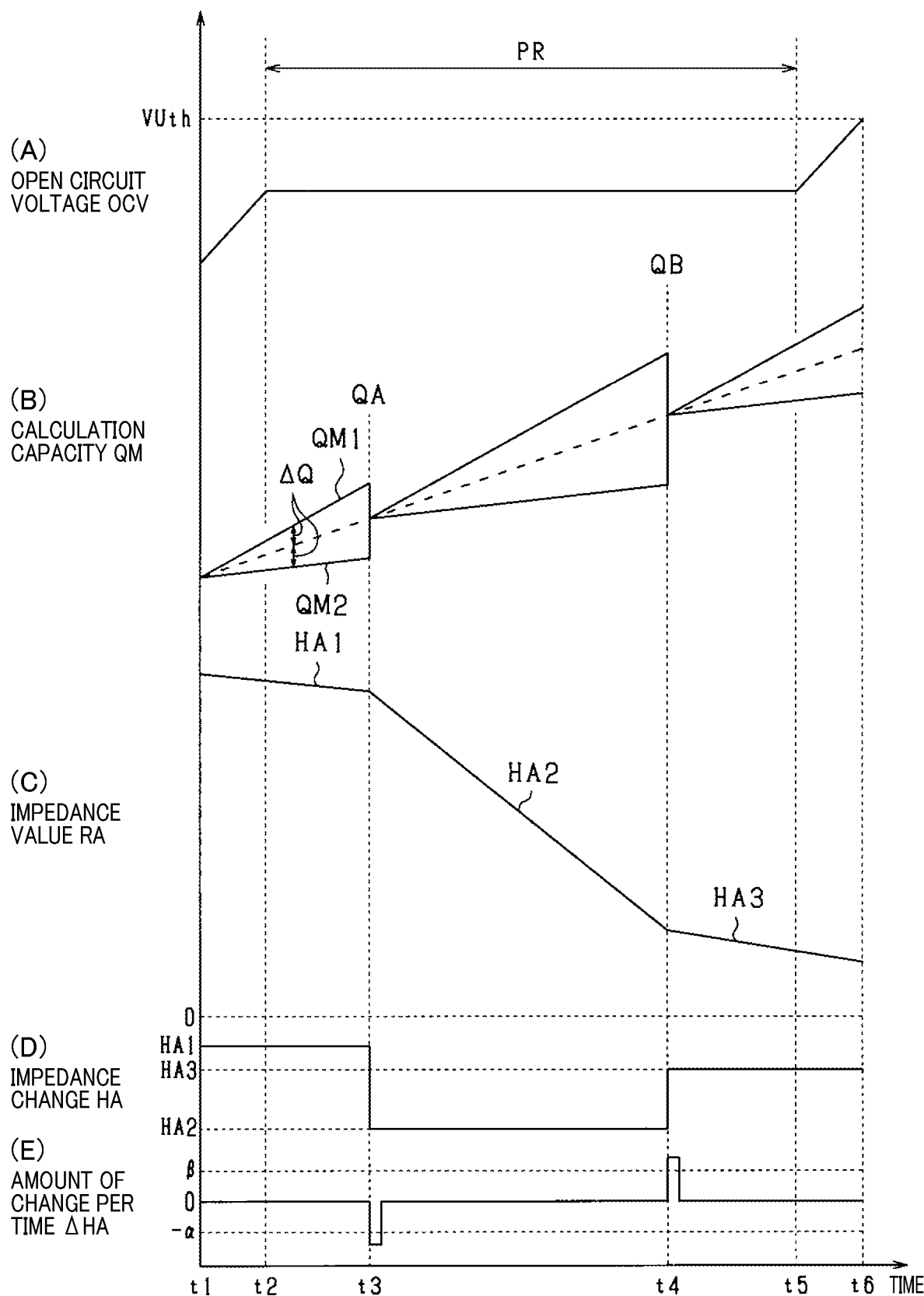
FIG. 4 is a timing diagram showing an example of the determination process according to the first embodiment.
Figure 5:
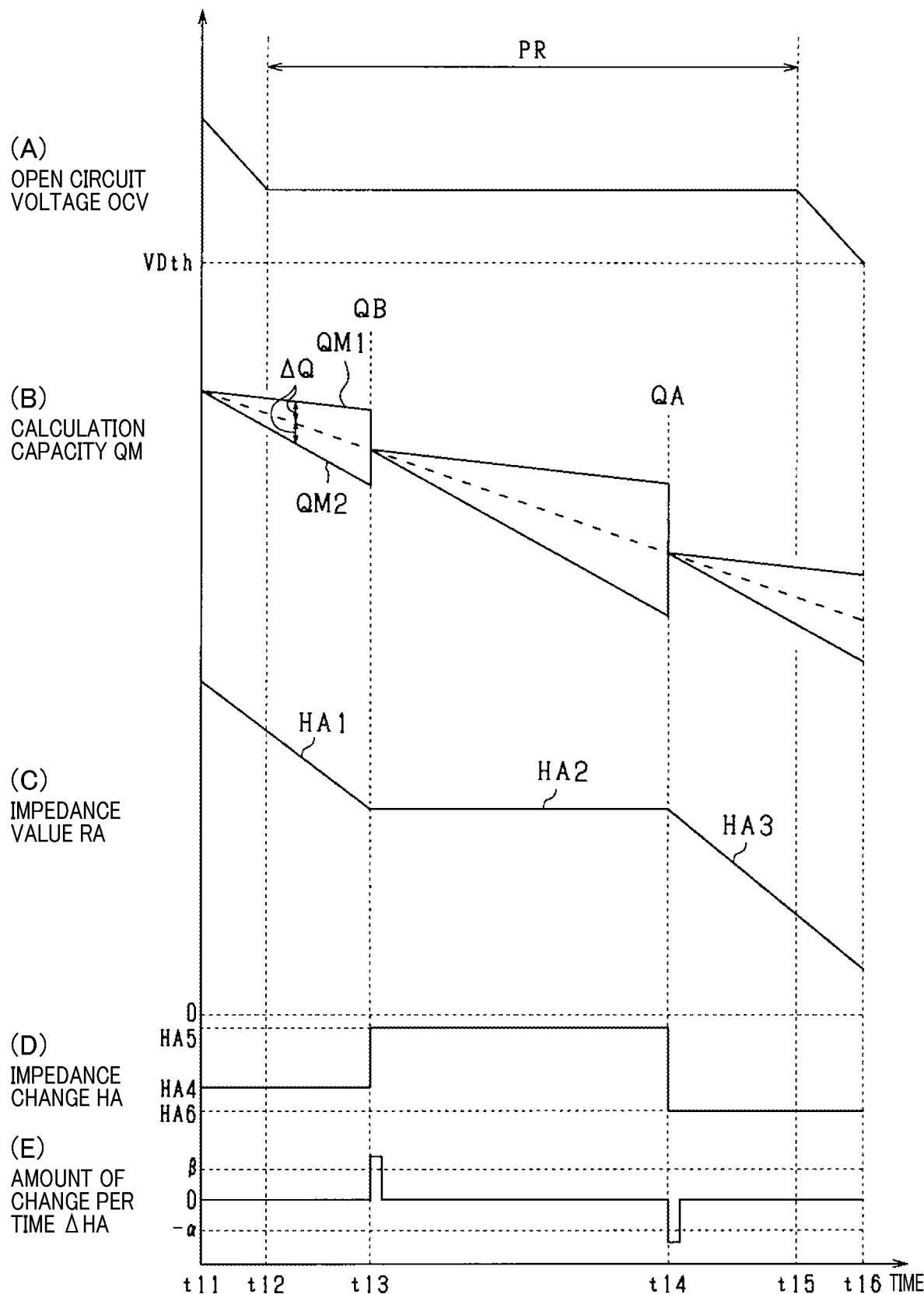
FIG. 5 is a timing diagram showing another example of the determination process according to the first embodiment.

According to the battery 40 of the present embodiment, as shown in FIGS. 4 and 5, the first and second capacities QA and QB are present in the plateau region PR. Hence, even in the plateau region where the SOC of the storage battery is difficult to be calculated using the SOC-OCV characteristics, the storage capacity of the battery 40 can be appropriately calculated.

Figure 3:
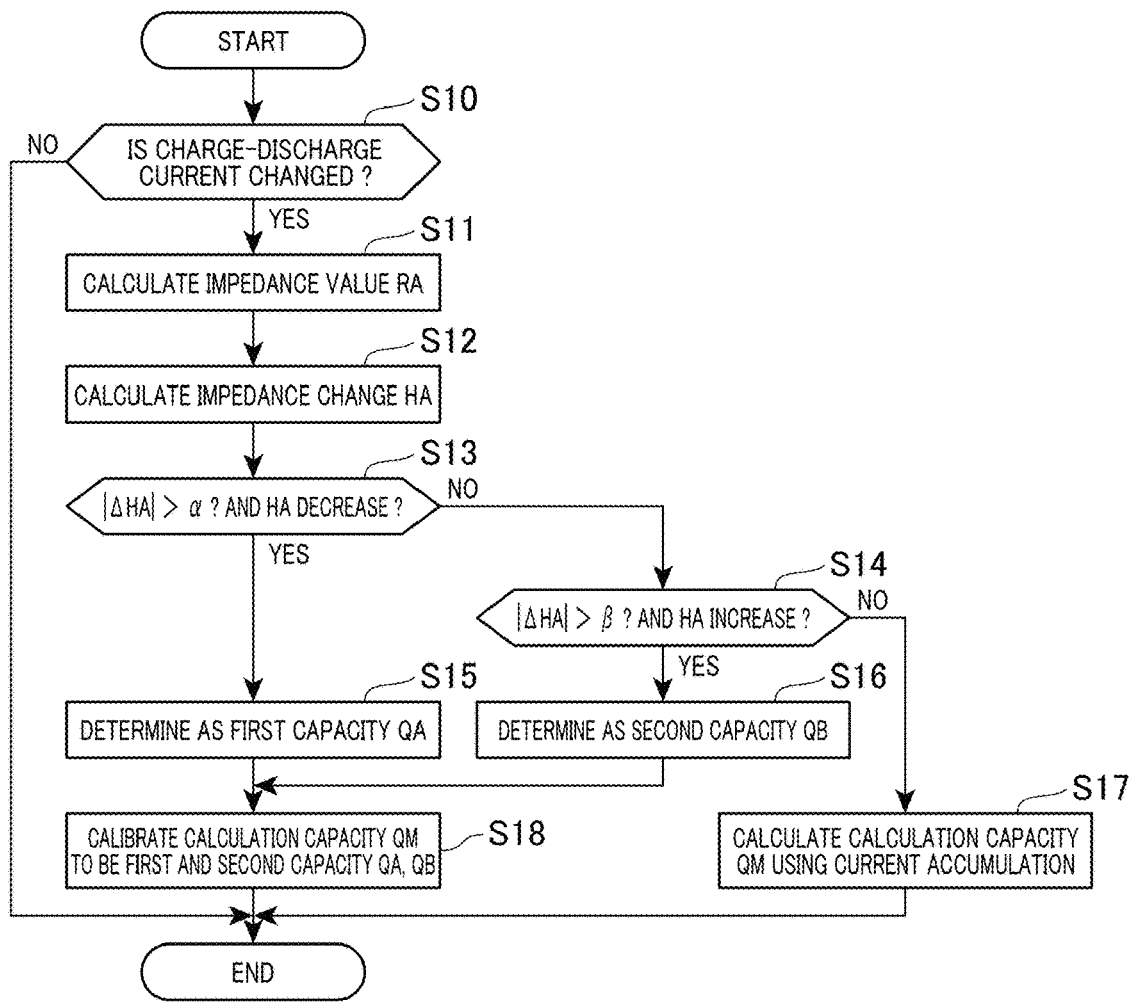
FIG. 3 is a flowchart showing a determination process according to the first embodiment.

FIG. 3 is a flowchart of a determination process of the present embodiment. The BMU 50 repeatedly performs the determination process at a predetermined control periods during the current conduction of the battery 40.

Once the determination process starts, the process determines whether the charge-discharge current IS changes by a threshold current or larger. When the determination at step S10 is negative, the process terminates the determination process. On the other hand, when the determination at step S10 is affirmative, the process proceeds to step S11.

At step S11, with the above-described method, the process calculates the impedance value RA of the battery 40. In the subsequent step S12, the process calculates the impedance change HA using the impedance value RA calculated at step S11, and proceeds to steps S13 and S14. Note that the process at step S12 corresponds to an acquiring unit.

At steps S13 and S14, the process determines, based on the impedance change HA calculated at step S12, whether the storage capacity of the battery 40 is the first capacity QA or the second capacity QB. Specifically, the process calculates an impedance change amount per time ΔHA which is an amount of change per time of the impedance change HA and determines whether the absolute value of the impedance change amount per time ΔHA is larger than a threshold α, β (α, β>0). According to the present embodiment, the processes of steps S13 and S14 correspond to a capacity determination unit.

At step S13, the process determines whether the absolute value of the impedance change amount per time ΔHA which is an amount of change per time of the impedance change HA is larger than the threshold α and whether the impedance change HA decreases in accompaniment with the current conduction. At the first capacity QA, in accompaniment with a change in the voltage change quantity ΔOCV, the absolute value of the impedance value change HA at a large capacity side is larger than that of a small capacity side during the charging, and the absolute value of the impedance value change HA at a small capacity side is larger than that of a large capacity side during the discharging. That is, at the first capacity QA, the impedance change HA decreases in accompaniment with the current conduction, whereby the impedance change amount per time ΔHA becomes smaller than the threshold −α. Hence, the determination at step S13 is affirmative. In this case, at step S15, the process determines that the storage capacity of the battery 40 is at the first capacity QA and proceeds to step S18. On the other hand, when the determination at step S13 is negative, the process proceeds to step S14.

At step S14, the process determines whether the absolute value of the impedance change amount per time ΔHA is larger than the threshold β and the impedance change amount per time ΔHA increases in accompaniment with the current conduction. Note that the threshold β may be the same or may not be the same as the threshold α. At the second capacity QB, in accompaniment with a change in the voltage change quantity ΔOCV, the absolute value of the impedance value change HA at large capacity side is larger than that of a small capacity side during the charging, and the absolute value of the impedance value change HA at small capacity side is larger than that of a large capacity side during the discharging. That is, at the second capacity QB, the impedance change HA increases in accompaniment with the current conduction, whereby the impedance change amount per time ΔHA becomes larger than the threshold β. Hence, the determination at step S14 is affirmative. In this case, at step S16, the process determines that the storage capacity of the battery 40 is at the second capacity QB and proceeds to step S18. On the other hand, when determined that the determination at step S14 is negative, the process proceeds to step S17.

At step S17, the process calculates the storage capacity of the battery using a current accumulation technique and terminates the determination process. At step S17, the charge-discharge current IS is accumulated, thereby calculating the storage capacity of the battery 40 as a calculation capacity QM. Specifically, at step S17, the process accumulates the charge-discharge current flowing into or out from the battery 40 during a period from the previous determination process to the current determination process, and adds the accumulated value to the calculation capacity QM at the previous determination process.

At step S18, the process calibrates the calculation capacity QM to be the first capacity QA or the second capacity QB and terminates the determination process. According to the present embodiment, at steps S17 and S18 correspond to calculation capacity calculation unit.

FIGS. 4 and 5 show an example of the determination process. FIG. 4 shows a trend of the calculation capacity QM in the case where the battery 40 is charged in a constant voltage charging using the external charger 200. In FIGS. 4 and 5, a timing (A) shows a change in the open circuit voltage OCV, a timing (B) shows a change in the calculation capacity QM, (C) shows a change in the impedance value RA, (D) shows a change in the impedance value change HA and a timing (E) shows a change in the impedance change amount per time ΔHA.

In a timing (B) in FIG. 4 and a timing (B) in FIG. 5, a dotted line indicates a true storage capacity, a solid line indicates a first calculation capacity QM1 as a calculation capacity where the accumulation error in the large capacity side is accumulated relative to the true storage capacity, and another solid line indicates a second calculation capacity Q2 as a calculation capacity where the accumulation error in the small capacity side is accumulated relative to the true storage capacity. Also, according to the present embodiment, in the impedance value RA of the battery 40, resistance value as a real part of the impedance value RA is utilized as an example. The timings (C) of FIGS. 4 and 5 each show a change in the resistance value.

In an example shown in FIG. 4, at time t1, constant-voltage charging starts in a state where the storage capacity of the battery 40 is lower than that in the plateau region PR. At the time t1, since the storage capacity of the battery 40 is not in the plateau region PR, the first and second calculation capacities QM1 and QM2 are calibrated using the SOC-OCV characteristics. Once the constant-voltage charging starts, the first and second calculation capacities QM1 and QM2 and the open circuit voltage increase. Since the first and second calculation capacities QM1 and QM2 are calculated using the current accumulation technique, the accumulation error ΔQ increases as the elapsed time from the time t1 increases. When the storage capacity of the battery 40 reaches a lower limit capacity of the plateau region PR at time t2, the open circuit voltage OCV stops increasing and remains at a substantially constant voltage.

The impedance value RA decreases, as the elapsed time increases from the time t1, at a predetermined first impedance change rate HA1. Thereafter at time t3, when the storage capacity is at the first capacity QA, the impedance value change HA of the impedance value RA decreases to a predetermined second impedance change rate HA2 from the first impedance change rate HA1. Thus, when the impedance change amount per time ΔHA of the impedance change HA is lower than the threshold $-\alpha$, the BMU 50 determines that the storage capacity is at the first capacity QA, and calibrates the first and second calculation capacity QM1 and QM2 to be the first capacity QA at time t3.

Thereafter, at time t4, when the storage capacity is at the second capacity QB, the impedance change HA of the impedance value RA increases to a predetermined third impedance change rate HA3 from the second impedance change rate HA2. Thus, when the impedance change amount per time ΔHA of the impedance change HA is larger than the threshold $\beta$, the BMU 50 determines that the storage capacity is at the second capacity QB, and calibrates the first and second calculation capacity QM1 and QM2 to be the second capacity QB at time t4.

Thereafter, when the storage capacity of the battery 40 reaches the upper limit capacity of the plateau region PR at time t5, the open circuit voltage OCV increases again. Then, the open circuit voltage OCV reaches a predetermined charge upper limit voltage VUth at time t6, the BMU 50 determines that the battery 40 is in a fully-charged state and terminates the constant-voltage charging of the battery 40 at the time t6.

FIG. 5 shows a change in the calculation capacity QM when discharging the battery 40 to the rotary electric machine 10. According to the example shown in FIG. 5, a discharging starts at time t11 in a state where the storage capacity of the battery 40 is higher than that in the plateau region PR. At time t11, since the storage capacity of the battery 40 is not in the plateau region PR, the first and second calculation capacities QM1 and QM2 are calibrated using the SOC-OCV characteristics. Then, when starting the discharging, the first and second capacities QM1 and QM2 and the open circuit voltage decrease. When the storage capacity of the battery 40 reaches the upper limit capacity of the plateau region PR at time t12, the open circuit voltage OCV stops decreasing and maintains at substantially constant value.

The impedance value RA decreases, as the elapsed time increases from the time t11, at a predetermined forth impedance change rate HA4. Thereafter at time t13, when the storage capacity is at the second capacity QB, the impedance value change HA of the impedance value RA increases to a predetermined fifth impedance change rate HA5 from the fourth impedance change rate HA4. Thus, when the impedance change amount per time ΔHA of the impedance change HA is higher than the threshold $-\beta$, the BMU 50 determines that the storage capacity is at the second capacity QB, and calibrates the first and second calculation capacity QM1 and QM2 to be the second capacity QB at the time t3.

Thereafter, at time t14, when the storage capacity is at the first capacity QA, the impedance change HA of the impedance value RA decreases to a predetermined sixth impedance change rate HA6 from the fifth impedance change rate HA5. Thus, when the impedance change amount per time ΔHA of the impedance change HA is smaller than the threshold $-\alpha$, the BMU 50 determines that the storage capacity is at the first capacity QA, and calibrates the first and second calculation capacity QM1 and QM2 to be the first capacity QA at the time t14.

Thereafter, when the storage capacity of the battery 40 reaches the lower limit capacity of the plateau region PR at time t15, the open circuit voltage OCV decreases again. Then, the open circuit voltage OCV reaches a predetermined charge lower limit voltage VDth at time t16, the BMU 50 determines that the battery 40 is in a completely discharged state and terminates the discharging of the battery 40 at the time t16.

According to the above-described present embodiment, the following effects and advantages can be obtained.

According to the present embodiment, the impedance value change HA battery 40 is calculated during the current conduction, and it is determined, based on the impedance value change HA, whether the storage capacity of the battery 40 corresponds to the first calculation capacity QM1 and the second calculation capacity QM2. Hence, the storage capacity of the battery 40 can be calculated using the impedance value change HA at the first and second calculation capacities QM1 and QM2, and the storage capacity of the battery 40 can be appropriately calculated without using the SOC-OCV characteristics.

In particular, according to the present embodiment, the battery 40 has a plateau region PR where the first and second calculation capacities QM1 and QM2 are present. Hence, even for the plateau region PR where the storage capacity is difficult to calculate using the SOC-OCV characteristics, the storage capacity of the battery 40 can be appropriately calculated using the first and second calculation capacities QM1 and QM2.

According to the present embodiment, with the current accumulation technique, the first and second calculation capacities QM1 and QM2 are calculated. According to the calculation of the storage capacity with the current accumulation technique, the accumulation error ΔQ is accumulated when the current accumulation period is longer, causing a deterioration of the calculation accuracy of the first and second calculation capacities QM1 and QM2. According to the present embodiment, the impedance value change HA at the first and second calculation capacities QM1 and QM2 of the battery 40 is used to calculate the storage capacity of the battery 40 and the first and second calculation capacities QM1 and QM2 are calibrated using the first and second calculation capacities QM1 and QM2. Hence, the accumulation error ΔQ of the first and second calculation capacities QM1 and QM2 can be cancelled.

Even when the impedance change HA of the battery 40 changes, if an amount of the change is small, the impedance change HA may be changed due to noise. According to the above-described configuration, in the case where an absolute value of the impedance change amount per time ΔHA is larger than a predetermined threshold α, β, the storage capacitor of the battery 40 is determined to be the first and the second calculation capacities QM1 and QM2. Accordingly, influence of noise is avoided and the storage capacity of the battery 40 can be appropriately calculated.

In the storage batteries, some batteries have a plurality of predetermined capacities in which relatively large voltage change amount ΔOCV occurs. In this case, even when the predetermined capacity is determined based on the impedance change HA, which predetermined capacity corresponds to one in the plurality of predetermined capacities.

In this respect, according to the present embodiment, as the predetermined capacity, the first capacity QA and the second capacity QB are present. During the charging, in the larger capacity side than the first capacity QA, an absolute value of the impedance change HA is higher than that of the small capacity side, and in the larger capacity side than the second capacity QB, an absolute value of the impedance change HA is smaller than that of the small capacity side. During the discharging, in the smaller capacity side than the first capacity QA, an absolute value of the impedance change HA is higher than that of the larger capacity side, and in the smaller capacity side than the second capacity QB, an absolute value of the impedance change HA is smaller than that of the large capacity side. In other words, the impedance change HA decreases in accompaniment with the current conduction at the first capacity QA and the impedance change HA increases in accompaniment with the current conduction at the second capacity QB. Therefore, in a secondary battery having a plurality of predetermined capacities, by using this difference of the impedance change HA, it can be determined whether the predetermined capacity is the first capacity QA or the second capacity QB.

Second Embodiment

Figure 6:
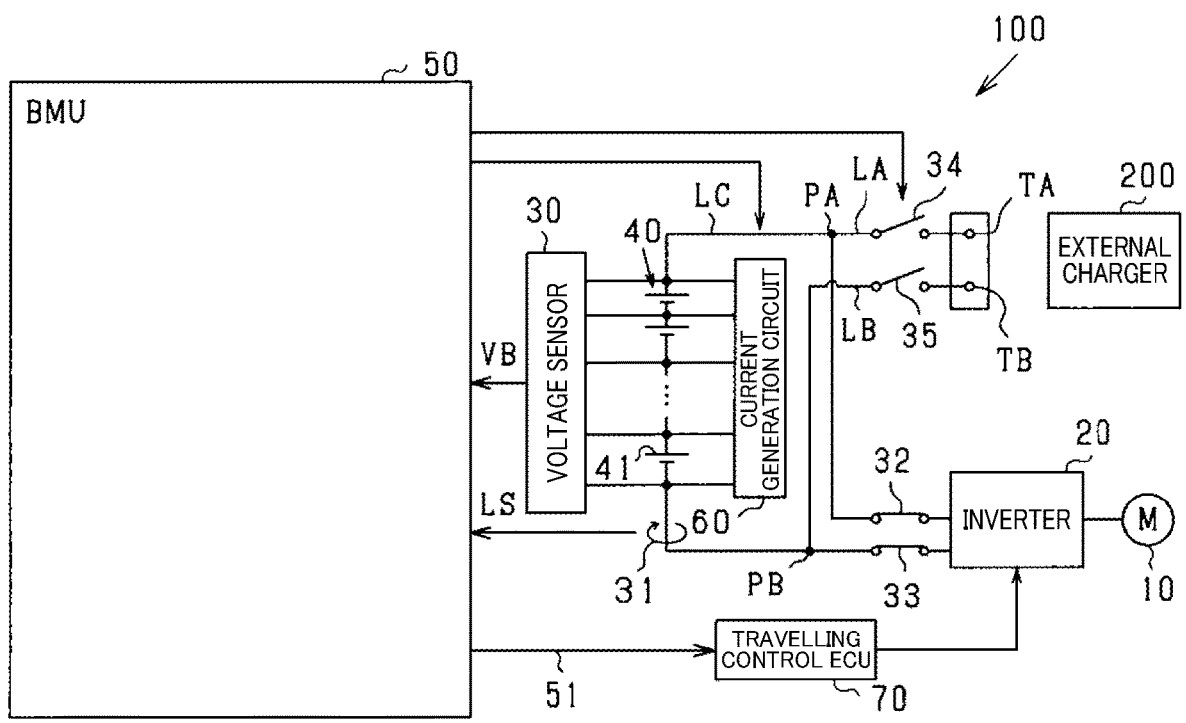
FIG. 6 is a block diagram showing an overall configuration of a battery control unit according to a second embodiment.
Figure 7:
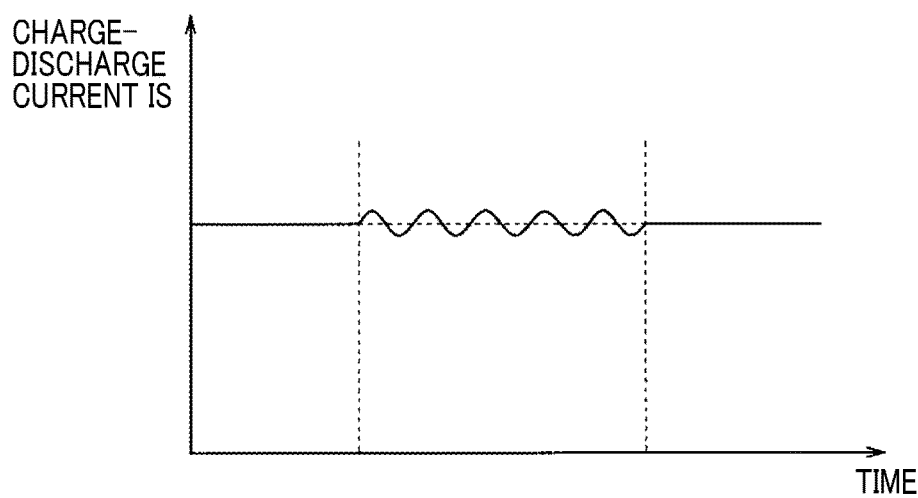
FIG. 7 is a graph showing superimposition of a current.

Hereinafter, with reference to FIGS. 6 to 8, for the second embodiment, configurations different from those in the first embodiment will mainly be described. The present embodiment differs from the first embodiment in that the battery control apparatus 100 includes a current generation circuit 60 as an AC current generation unit.

As described, the impedance value RA is calculated using a change amount ΔVB of the battery voltage VB and a change amount ΔIS of the current IS when the charge-discharge current changes. Hence, for example, in the case where the battery 40 is charged with constant current charging, since the charge-discharge current does not change, the impedance value RA is not calculated and the impedance value change HA cannot be calculated. Hence, It cannot be determined whether the storage capacity of the battery 40 is at the first and the second calculation capacities QM1 and QM2 based on the impedance value change HA.

In this respect, the battery control apparatus 100 according to the present embodiment is provided with a current generation circuit 60. The current generation circuit 60 generates an AC current IA in order to calculate the impedance value RA, other than the charge-discharge current IS by the rotary electric machine 10 and the external charger 200. As shown in FIG. 6, the current generation circuit 60 is connected to both ends of the respective lithium-ion battery cells 41 that constitute the battery 40. The current generation circuit 60 is provided with an AC power source and applies the AC voltage to respective lithium-ion battery cells 41 individually using the AC power source to generate the AC current IA.

The BMU 50 is connected to the current generation circuit 60 and switches states between a state where the AC current IA is generating at the respective lithium-ion battery cells 41 and a state where the AC current IA is not generating at the respective lithium-ion battery cells 41. Thus, the BMU 50 switches states between a state where the AC current IA is superposed on the charge-discharge current IS and a state where the AC current IA is not superposed on the charge-discharge current IS.

Figure 8:
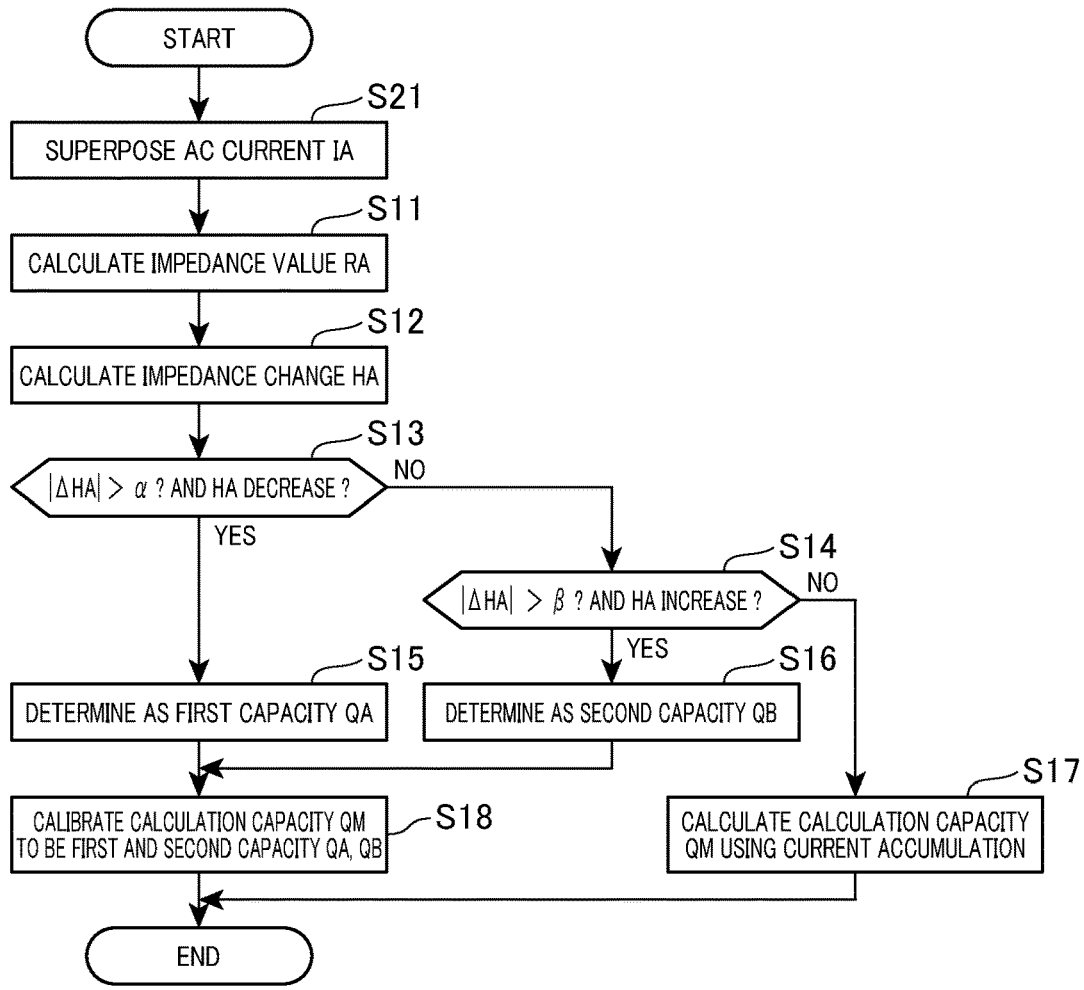
FIG. 8 is flowchart showing a determination process according to the second embodiment.

FIG. 8 shows a state where the Ac current IA is superposed on the charge-discharge current IS. According to the present embodiment, the AC current IA is expressed as sinusoidal waves. The frequency of the sinusoidal waves may preferably be smaller than or equal to 1 KHz. This is because, with the frequency higher than or equal to 1 KHz, an impedance value RA of an ionic conduction component having significant temperature dependence is acquired. As shown in FIG. 7, an amplitude of the AC current IA is much smaller than the absolute value of the charge-discharge current IS. According to the determination process of the present embodiment, the impedance value change HA is calculated when the charge-discharge current IS changes by the AC current IA. In other words, the impedance value change HA is calculated when the current generation circuit 60 generates the AC current IA.

FIG. 8 shows a flowchart showing a determination process of the present embodiment. In FIG. 6, the same step numbers are applied to processes same as those shown in FIG. 3 for the sake of convenience and the explanation thereof will be omitted.

As shown in FIG. 8, according to the determination process of the present embodiment, once the determination process starts, firstly at step S21, the AC current IA is superposed on the charge-discharge current IS and control proceeds to steps S11 and S12. In this case, at step S12, the impedance value change HA is calculated when superposing the AC current at step S21. According to the present embodiment, the process at step S21 corresponds to an AC current generation unit.

According to the above-described present embodiment, the following effects and advantages can be obtained.

According to the present embodiment, the current generation circuit 60 is provided to superpose the AC current IA on the charge-discharge current. The current generation circuit 60 is used, whereby the charge-discharge current IS can be changed using the AC current IA. Hence, even in the case where the battery 40 is charged with constant current charging such that a change in the charge-discharge current IS is small before being superposed, the storage capacity of the battery 40 can be appropriately calculated.

According to the present embodiment, for the current superposed on the charge-discharge current IS, the AC current IA is used. Accordingly, comparing with a case where the DC current is used, a deterioration due to EMC can be suppressed.

Third Embodiment

Hereinafter, with reference to FIGS. 9 to 10, for the third embodiment, configurations different from those in the first embodiment will mainly be described. The present embodiment differs from the first embodiment in that a discharge capacity of the battery 40 is calculated as a calculation discharge capacity QH. The discharge capacity is s storage capacity of the battery 40 in the fully-charged state.

Figure 9:
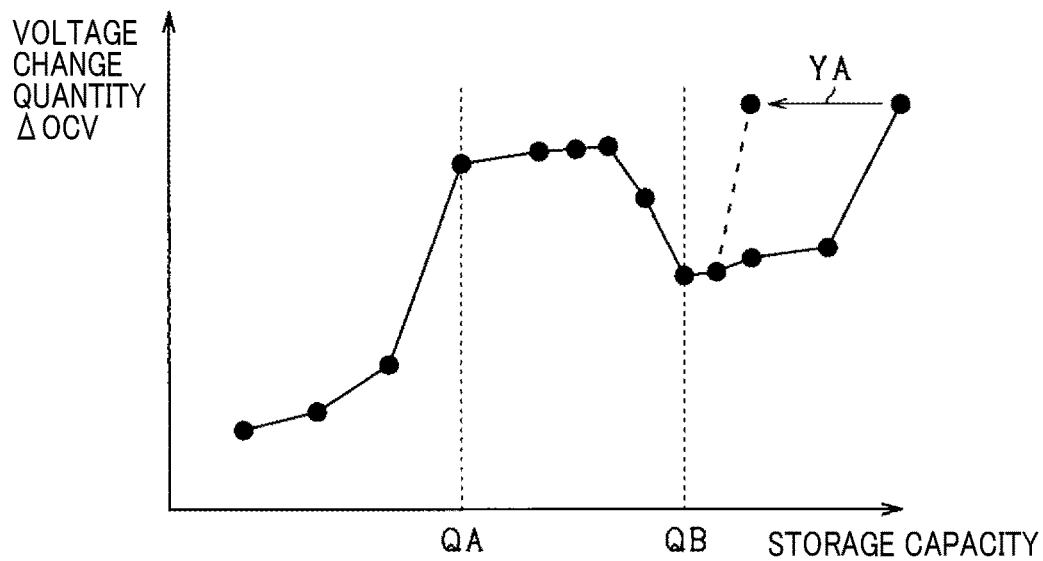
FIG. 9 is a graph showing a change in a discharge capacity in accompaniment with a deterioration of the battery.
Figure 10:
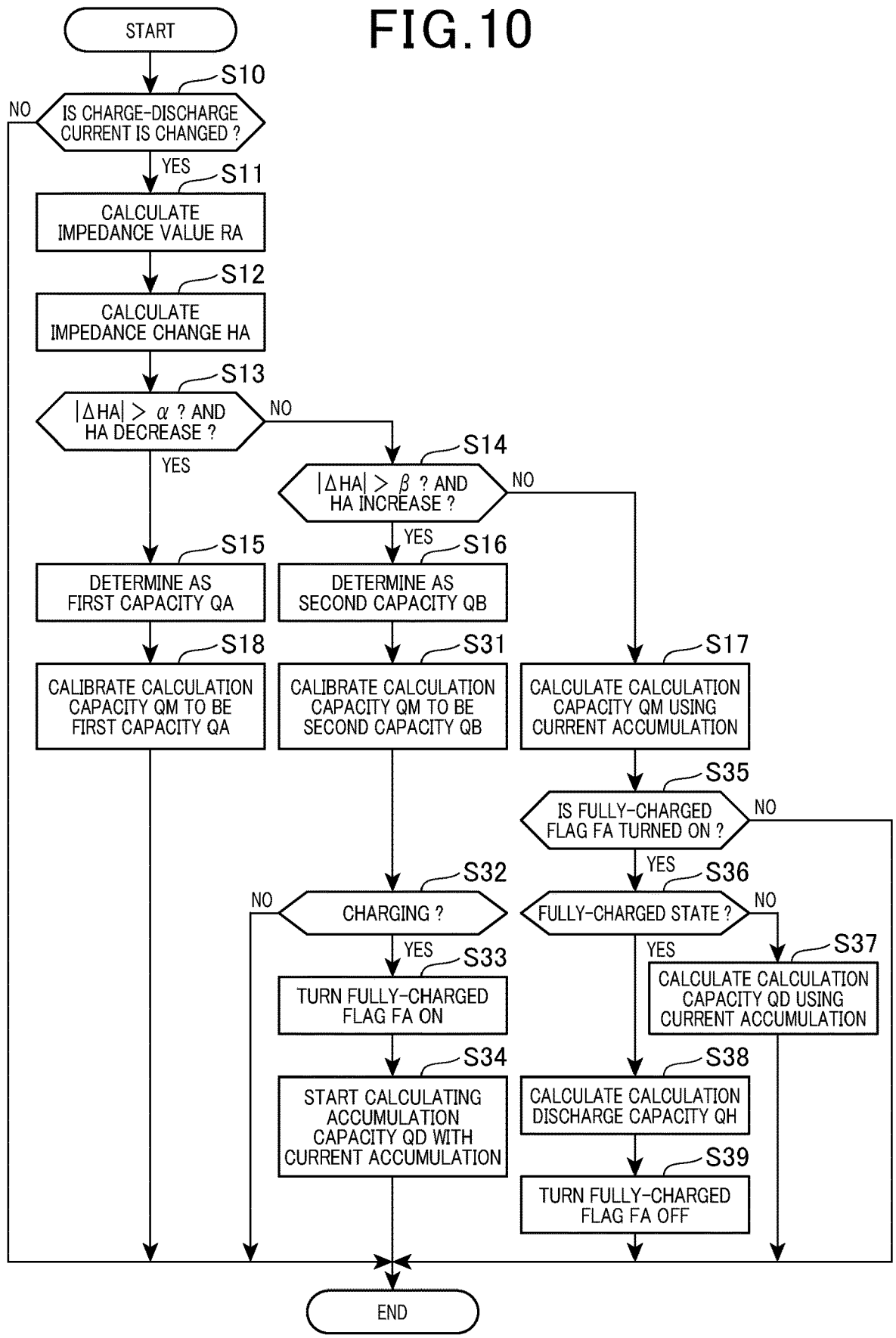
FIG. 10 is a flowchart showing a determination process according to a third embodiment.

FIG. 9 shows a change in the discharge capacity in accompaniment with a deterioration of the battery 40. In FIG. 9, a solid line indicates a relationship between the storage capacity when the battery 40 is manufactured and the voltage change quantity ΔOCV, and a dotted line indicates a relationship between the storage capacity after the battery 40 starts to be used and the voltage change quantity ΔOCV. As shown by an arrow YA in FIG. 9, in the battery 40, the discharge capacity 40 decreases in accompaniment with a deterioration of the battery 40. On the other hand, the first and second capacities QA and QB do not change even when the discharge capacity decreases. According to the present embodiment, focusing on this phenomenon, the calculation discharge capacity QH is calculated based on the second capacity QB.

FIG. 8 is a flowchart showing a determination process of the present embodiment. Specifically, the flowchart of FIG. 8 shows a determination process for calculating the calculation discharge capacity QH during the charging of the battery 40. In FIG. 8, the same step numbers are applied to processes same as those shown in FIG. 3 for the sake of convenience and the explanation thereof will be omitted.

As shown in FIG. 8, according to the determination process of the present embodiment, the process determines that the storage capacity of the battery 40 is the first capacity QA at step S15, calibrates the calculation capacity QM to be the first capacity QA at step S18, and terminates the determination process.

The process determines that the storage capacity of the battery 40 is the second capacity QB at step S16, calibrates the calculation capacity QM to be the second capacity QB at step S31. At subsequent step S32, the process determines whether the battery 40 is in a charging state. It is determined whether the battery 40 is in the charging with a direction of the charge-discharge current IS detected by the current sensor 31. When the determination at step S32 is negative, the process terminates the determination process. On the other hand, when the determination at step S32 is affirmative, the process proceeds to step S33.

At step S33, the process turns the fully-charged flag FA ON and proceeds to step S34. The fully-charged flag FA indicates that the storage capacity of the battery 40 is larger than or equal to the second capacity QB and the battery 40 is in a charging state. The fully-charged flag FA is turned ON when the above two conditions are satisfied.

At step S34, the process starts to calculate an accumulation capacity QD using a current accumulation and terminates the determination process. The accumulation capacity QD refers to an amount of accumulation of the charge-discharge current IS flowing into and flowing out from the battery 40 in a period from a time when the storage capacity of the battery 40 is determined to be the second capacity QB to a time when the battery 40 is determined to be in the fully-charged state. According to the present embodiment, the timing at which the process at step S16 is performed corresponds to a first timing.

When the calculation capacity QM is calculated with the current accumulation at step S17, the process determines whether the fully-charged flag FA is turned ON at step S35. When the determination at step S35 is negative, the process terminates the determination process. On the other hand, when the determination at step S35 is affirmative, the process proceeds to step S36.

At step S36, the process determines whether the battery 40 is in the fully-charged state. When the determination at step S36 is negative, the process proceeds to step S37. At step S37, the process calculates the accumulation capacity QD with the current accumulation and terminates the determination process.

On the other hand, the determination at step S36 is affirmative, the process proceeds to step S38. At step S38, the process adds the accumulation capacity QD on the second capacity QD, thereby calculating the calculation discharge capacity QH. Next at step S39, the process turns the fully-charged flag FA OFF and terminates the determination process. According to the present embodiment, the process at step S36 corresponds to fully-charged state determination unit, and the process at step S38 corresponds to discharge capacity calculation unit. Further, the timing at which the affirmative determination is made at step S36 corresponds to a second timing.

According to the above-described present embodiment, the calculation discharge capacity QH is calculated using the second capacity QB. In the battery 40, the discharge capacity decreases due to deterioration of the battery. On the other hand, the second capacity 40 is not changed even if the battery 40 is degraded. Hence, the second capacity, which is not changed even with the deterioration of the battery 40, is utilized to calculate the calculation discharge capacity QH. Accordingly, the calculation discharge capacity QH can be appropriately calculated.

Other Embodiments

The present disclosure is not limited to the content of the above-described embodiments, but may be embodied in the following manner.

In the above-described embodiments, in the determination process, a case is exemplified in which the absolute value of the impedance change amount per time ΔHA which is an amount of change per time of the impedance change HA is compared with the thresholds α and β. However, it is not limited thereto. For example, the impedance change amount per time ΔHA itself may be compared with the thresholds −α and β.

According to the above-described embodiments, in the determination process, when calibrating the calculation capacity QM using the first and second capacities QA and QB, the calculation capacity QM is calibrated to be the first and second capacities QA and QB. However, it is not limited thereto. For example, during the charging of the battery 40, considering an amount of increase in the storage battery due to the charging until the calibration is actually performed, the calculation capacity QM may be calibrated to be a capacity value where the amount of increase is added to the first and second capacities QA and QB. Also, for example, during the discharging of the battery 40, considering an amount of decrease in the storage battery due to discharging until the calibration is actually performed, the calculation capacity QM may be calibrated to be a capacity value where the amount of decrease is subtracted from the first and second capacities QA and QB.

According to the above-described embodiments, as the impedance value used for the determination process, a resistance value which is a real component of the impedance value is exemplified. However, it is not limited thereto. For example, an imaginary component of the impedance value may be used or a phase of the impedance value, that is, a phase difference between the charge-discharge current IS and the battery voltage VB. Moreover, an absolute value of the impedance value may be used.

According to the above-described second embodiment, sinusoidal waves are exemplified as a wave of the AC current IA to be superposed on the charge-discharge current IS, but it is not limited to thereto. For example, periodic waves such as trapezoidal waves or rectangular waves may be used.

According to the above-described embodiments, a case is exemplified in which the AC current IA is applied to the battery 40 only when the impedance value RA is calculated. However, it is not limited thereto. For example, the AC current IA may be always applied to the battery 40. In this case, the BMU 50 may not control the current generation circuit 60.

The above-described second embodiment exemplifies a case where the frequency of the sinusoidal waves generated by the current generation circuit 60 is set to be lower than or equal to 1 KHz and the impedance RA of ion-conductive component having significant temperature dependence is acquired. However, it is not limited thereto. For example, the frequency of the sinusoidal waves may be set to be higher than 1 KHz. With the frequency set higher than 1 KHz, similar to the case of the frequency set lower than 1 KHz, the impedance RA has characteristics in which the higher the battery temperature, the lower the impedance value RA is. Hence, even in the case where the frequency is set to be higher than 1 KHz, the impedance value RA can be acquired.

According to the above-described second embodiment, a case is exemplified in which when superposing the AC sinusoidal current IA on the charge-discharge current IS, assuming that the amplitude of the AC current IA is an amplitude WA, the maximum value of the current after the superposing equals to the charge-discharge current IS+the amplitude WA, and the minimum value thereof equals to the charge-discharge current IS−the amplitude WA. However, it is not limited thereto. For example, when it is possible to adjust the AC current IA such that the maximum value equal to the charge-discharge current IS and the minimum value equals the charge-discharge current IS−2×amplitude WA, the AC current IA may be adjusted such that the maximum value is the charge-discharge current IS+2×amplitude WA, and the minimum value is the charge-discharge current IS.

According to the above-described third embodiment, in the determination process, it is exemplified that the calculation discharge capacity QH is calculated when charging the battery 40, but the calculation discharge capacity QH may be calculated when discharging the battery 40. For example, the calculation discharge capacity QH may be calculated in the following manner. When the battery is discharged from the fully-charged state, an accumulation capacity QD is calculated, which is accumulated from when the discharge starts to when the storage capacity of the battery 40 is determined to be the second capacity QB, the calculated accumulation capacity is added to the second capacity QB, thereby calculating the calculation discharge capacity QH.

According to the above-described embodiments, as a method for calculating the calculation capacity QM, a current accumulation technique is exemplified. However, it is not limited to this method. For example, a known technique such as a method for calculating the storage capacity of the battery 40 may be used.

According to the above-described embodiments, a case is exemplified in which a storage battery having a plateau region PR is used as a battery 40. However, the technique disclosed in the above-embodiments may be used for a storage battery having no plateau region PR.

According to the above-described embodiments, a case is exemplified in which a battery 40 having two predetermined capacities of first capacity QA and a second capacity QB is used. However, it is not limited thereto. The number of predetermined capacities and an amount of each capacity varies depending on the cathode active substance and the anode active substance used for the battery 40. The technique of the present embodiment may be utilized regardless of the number of predetermined capacities and an amount of each capacity.

According to the above-described embodiments, a case is exemplified in which a change quantity per unit time is used as an impedance change of a secondary battery. However, it is not limited thereto. For example, a change quantity per unit capacity may be used.

The control apparatus and method thereof disclosed in the present disclosure may be accomplished by a dedicated computer constituted of a processor and a memory programmed to execute one or more functions embodied by computer programs. Alternatively, the control apparatus and method thereof disclosed in the present disclosure may be accomplished by a dedicated computer provided by a processor configured of one or more dedicated hardware logic circuits. Further, the control apparatus and method thereof disclosed in the present disclosure may be accomplished by one or more dedicated computers where a processor and a memory programmed to execute one or more functions, and a processor configured of one or more hardware logic circuits are combined. Furthermore, the computer programs may be stored, as instruction codes executed by the computer, into a computer readable non-transitory tangible recording media.

The present disclosure has been described in accordance with the embodiments. However, the present disclosure is not limited to the embodiments and structure thereof. The present disclosure includes various modification examples and modifications within the equivalent configurations. Further, various combinations and modes and other combinations and modes including one element or more or less elements of those various combinations are within the range and technical scope of the present disclosure.

CONCLUSION

The present disclosure has been achieved in light of the above-described circumstances, and to provide a battery monitoring apparatus capable of appropriately calculating the storage capacity of the secondary battery without using the SOC-OCV characteristics.

A first means to solve the above-described issues is applied to a secondary battery that produces a change in reaction heat reaction heat at a predetermined capacity when a storage capacity changes in accompaniment with a current conduction, and is provided with an acquiring unit that acquires, during current conduction, an impedance change of the secondary battery; and a capacity determination unit that determines, based on the impedance change acquired by the acquiring unit, that the storage capacity of the secondary battery is the predetermined capacity.

In the secondary battery that produces a change in reaction heat at a predetermined capacity in accompaniment with the current conduction, the temperature of the secondary battery changes in accompaniment with a change in the reaction heat. The secondary battery has a correlation between the temperature and the impedance value. The impedance value of the secondary battery changes when the temperature of the secondary battery changes. In other words, according to the above-described secondary battery, the impedance value of the secondary battery changes at a predetermined capacity. The present disclosers have focused on this point and discovered the method for calculating the storage capacity.

Specifically, according to the above-described configuration, a change in the impedance value of the secondary battery is acquired during current conduction and the storage capacity of the secondary battery is determined, based on the change in the impedance value, to be a predetermined capacity. Hence, the storage capacity of the secondary battery can be calculated using the impedance change at the predetermined capacity of the secondary battery. Therefore, without using the SOC-OCV characteristics, the storage capacity of the secondary battery can be appropriately calculated.

As a second means, the capacity determination unit determines that the storage capacity of the secondary battery is the predetermined capacity when an absolute value of an amount of the impedance change per time is larger than a predetermined threshold.

Even when the impedance value of the secondary battery changes, if the amount of change is small, the impedance value is likely to change due to noise or the like. According to the above-described configuration, the storage capacity of the secondary battery is determined to be the predetermined capacity when an absolute value of an amount of the impedance change per time is larger than a predetermined threshold. Hence, influence of the noise is avoided and the storage capacity of the secondary battery can be appropriately calculated.

A third means is applied to the secondary battery in which the predetermined capacity includes a first capacity and a second capacity; during charging, in a larger capacity side than the first capacity, an absolute value of the impedance change is higher than that of a smaller capacity side thereof, and in a larger capacity side than the second capacity, an absolute value of the impedance change is smaller than that of a smaller capacity side thereof; during discharging, in a smaller capacity side than the first capacity, an absolute value of the impedance change is higher than that of a larger capacity side thereof, and in a smaller capacity side than the second capacity, an absolute value of the impedance change is smaller than that of a larger capacity side thereof; and the capacity determination unit determines the storage capacity of the secondary battery to be the first capacity when the impedance change decreases in accompaniment with the current-conduction and determines the storage capacity of the secondary battery to be the second capacity when the impedance change increases in accompaniment with the current-conduction.

For the secondary battery, some batteries have a plurality of predetermined capacities. In this case, even when the predetermined capacity is determined based on the impedance change, it cannot be determined which predetermined capacity corresponds to one in the plurality of predetermined capacities. In this respect, according to the present embodiment, as the predetermined capacity, there are first and second capacities. During charging, in a larger capacity side than the first capacity, an absolute value of the impedance change is higher than that of a smaller capacity side thereof, and in a larger capacity side than the second capacity, an absolute value of the impedance change is smaller than that of a smaller capacity side thereof. Also, during discharging, in a smaller capacity side than the first capacity, an absolute value of the impedance change is higher than that of a larger capacity side thereof, and in a smaller capacity side than the second capacity, an absolute value of the impedance change is smaller than that of a larger capacity side thereof. Hence, at the first capacity, the impedance change decreases in accompaniment with the current-conduction and at the second capacity, the impedance change increases in accompaniment with the current-conduction. Accordingly, in the secondary battery having a plurality of predetermined capacities, by using this difference of the impedance change, it can be determined whether the predetermined capacity is the first capacity or the second capacity.

According to a fourth means, provided is a calculation capacity calculation unit (50) that accumulates a current flowing into and flowing out from the secondary battery to calculate the storage battery of the secondary battery to be a calculation capacity; and the calculation capacity calculation unit calibrates the calculation capacity using the predetermined capacity when the capacity determination unit determines that the storage capacity of the secondary battery is the predetermined capacity.

Calculating the storage capacitor using a current accumulation technique, when the current accumulation period is longer, an accumulation error becomes larger, which causes deterioration of the calculation accuracy. In this respect, according to the above-described configuration, since the predetermined capacity is used to calibrate the calculation capacity, the accumulation error of the calculation capacity can be cancelled.

According to a fifth means, provided is an AC current generation unit that produces a predetermined AC current to be superposed on a current flowing into and flowing out from the secondary battery; and the acquiring unit acquires the impedance change when the AC current generation unit generates the predetermined AC current.

Since the impedance of the secondary battery changes when the current flowing into or out from the secondary battery changes, the impedance change is acquired when the current changes. However, for example, when the secondary battery is charged with constant current charging, that is, a change in the current flowing into or out from the secondary battery is small, the impedance change of the secondary battery cannot be acquired and thus it cannot be determined whether the storage capacity of the secondary battery is the predetermined capacity. In this respect, according to the above-described configuration, an AC current generation unit is provided to cause the AC current to be superposed on the current flowing into or out from the secondary battery. By using the AC current, the current flowing into or out from the secondary battery is caused to change, whereby the storage capacity of the secondary battery can be appropriately calculated even when a change in the current is small before superposing the AC current, and the storage capacity of the secondary battery can be determined.

According to a six means, a fully-charged state determination unit and a discharge capacity calculation unit are provided. The fully-charged state determination unit determines whether the secondary battery is in a fully-charged state; and the discharge capacity calculation unit calculates a discharge capacity of the secondary battery by using an amount of accumulation of a current flowing into and flowing out from the secondary battery, during a period between a first timing at which the capacity determination unit determines that storage capacity of the secondary battery is the predetermined capacity and a second timing at which the fully-charged state determination unit determines that the secondary battery is in the fully-charged state, and the predetermined capacity.

In the secondary battery, the discharge capacity indicating a degree of deterioration of the secondary battery decreases because of a deterioration of the secondary battery. On the other hand, the predetermined capacity does not change even with the deterioration of the secondary battery. According to the above-described configuration, the predetermined capacity which does not change with a deterioration of the secondary battery is utilized to calculate the discharge capacity. Therefore, the discharge capacity of the secondary battery can be appropriately calculated.

According to a seventh means, the secondary battery has a plateau region where a change in an open circuit voltage of the secondary battery in accompaniment with a change in the storage capacity of the secondary battery is small; and the predetermined capacity is in the plateau region.

According to the secondary battery having a plateau region, it is difficult to calculate the storage capacity in the plateau region using the SOC-OCV characteristics.

In this respect, according to the above-described configuration, since the predetermined capacity, at which a change in reaction heat is produced, is present in the plateau region, the storage capacity of the secondary battery in the plateau region can be calculated using this predetermined capacity.

What is claimed is:

1. A battery monitoring apparatus for a secondary battery that produces a change in reaction heat at a predetermined capacity when a storage capacity changes in accompaniment with a current conduction, the battery monitoring apparatus comprising:
   an acquiring unit that acquires, during current conduction, an impedance change of the secondary battery; and
   a capacity determination unit that determines, based on the impedance change acquired by the acquiring unit, that the storage capacity of the secondary battery is the predetermined capacity when an absolute value of an amount of the impedance change per time is larger than a predetermined threshold.

2. The battery monitoring apparatus according to claim 1, wherein
   the battery monitoring apparatus is applied to the secondary battery;
   the predetermined capacity includes a first capacity and a second capacity;
   during charging, in a larger capacity side than the first capacity, an absolute value of the impedance change is higher than that of a smaller capacity side thereof, and in a larger capacity side than the second capacity, an absolute value of the impedance change is smaller than that of a smaller capacity side thereof;
   during discharging, in a smaller capacity side than the first capacity, an absolute value of the impedance change is higher than that of a larger capacity side thereof, and in a smaller capacity side than the second capacity, an absolute value of the impedance change is smaller than that of a larger capacity side thereof; and
   the capacity determination unit determines the storage capacity of the secondary battery to be the first capacity when the impedance change decreases in accompaniment with the current-conduction and determines the storage capacity of the secondary battery to be the second capacity when the impedance change increases in accompaniment with the current-conduction.

3. The battery monitoring apparatus according to claim 1, wherein
   the battery monitoring apparatus further comprises a calculation capacity calculation unit that accumulates a current flowing into and flowing out from the secondary battery to calculate the storage capacity of the secondary battery to be a calculation capacity; and
   the calculation capacity calculation unit calibrates the calculation capacity using the predetermined capacity when the capacity determination unit determines that the storage capacity of the secondary battery is the predetermined capacity.

4. The battery monitoring apparatus according to claim 1, wherein
   the battery monitoring apparatus further comprises an AC current generation unit that produces a predetermined AC current to be superposed on a current flowing into and flowing out from the secondary battery; and
   the acquiring unit acquires the impedance change when the AC current generation unit generates the predetermined AC current.

5. The battery monitoring apparatus according to claim 1, wherein
   the battery monitoring apparatus further comprises a fully-charged state determination unit and a discharge capacity calculation unit;
   the fully-charged state determination unit determines that the secondary battery is in a fully-charged state; and
   the discharge capacity calculation unit calculates a discharge capacity of the secondary battery by using an amount of accumulation of a current flowing into and flowing out from the secondary battery, during a period between a first timing at which the capacity determination unit determines that storage capacity of the secondary battery is the predetermined capacity and a second timing at which the fully-charged state determination unit determines that the secondary battery is in the fully-charged state, and the predetermined capacity.

6. The battery monitoring apparatus according to claim 1, wherein
   the secondary battery has a plateau region where a change in an open circuit voltage of the secondary battery in accompaniment with a change in the storage capacity of the secondary battery is smaller than in other regions of the secondary battery; and
   the predetermined capacity is in the plateau region.

* * * * *